United States Patent
Ladd

(10) Patent No.: US 7,642,107 B2
(45) Date of Patent: Jan. 5, 2010

(54) SPLIT TRANSFER GATE FOR DARK CURRENT SUPPRESSION AN IMAGER PIXEL

(75) Inventor: John Ladd, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 295 days.

(21) Appl. No.: 11/642,868

(22) Filed: Dec. 21, 2006

(65) Prior Publication Data

US 2007/0102781 A1    May 10, 2007

Related U.S. Application Data

(62) Division of application No. 11/019,232, filed on Dec. 23, 2004.

(51) Int. Cl.
 H01L 21/00    (2006.01)
 H01L 21/4763  (2006.01)
(52) U.S. Cl. .............. 438/20; 438/22; 438/30; 438/45; 438/75; 438/587; 438/593; 257/53; 257/E21.65
(58) Field of Classification Search ............. 438/20, 438/22, 30, 45, 75, 587, 593; 257/53, E21.65
See application file for complete search history.

(56) References Cited

U.S. PATENT DOCUMENTS

| | | | |
|---|---|---|---|
| 3,824,337 A * | 7/1974 | Sangster et al. ............. 348/309 |
| 5,204,835 A * | 4/1993 | Eitan ...................... 365/185.16 |
| 5,323,020 A | 6/1994 | Mohammad et al. | |
| 5,608,243 A | 3/1997 | Chi et al. | |
| 5,745,412 A * | 4/1998 | Choi ....................... 365/185.1 |
| 6,410,957 B1 * | 6/2002 | Hsieh et al. .................. 257/321 |
| 7,038,259 B2 | 5/2006 | Rhodes | |
| 7,342,269 B1 | 3/2008 | Yuzurihara | |
| 7,446,357 B2 * | 11/2008 | McKee ...................... 257/292 |
| 2002/0109164 A1 | 8/2002 | Rhodes | |
| 2002/0110039 A1 * | 8/2002 | Forbes et al. ........... 365/230.06 |
| 2002/0171097 A1 | 11/2002 | Chen et al. | |
| 2006/0226428 A1 | 10/2006 | Mouli | |

* cited by examiner

Primary Examiner—Thanh V Pham
(74) Attorney, Agent, or Firm—Dickstein Shapiro LLP

(57) ABSTRACT

A pixel with a photosensor and a transfer transistor having a split transfer gate. A first section of the transfer gate is connectable to a first voltage source while a second section of the transfer gate is connectable to a second voltage source. Thus, during a charge integration period of a photosensor, the two sections of the transfer gate may be oppositely biased to decrease dark current while controlling blooming of electrons within and out of the pixel cell. During charge transfer the two gate sections may be commonly connected to a positive voltage sufficient to transfer charge from the photosensor to a floating diffusion region.

11 Claims, 15 Drawing Sheets

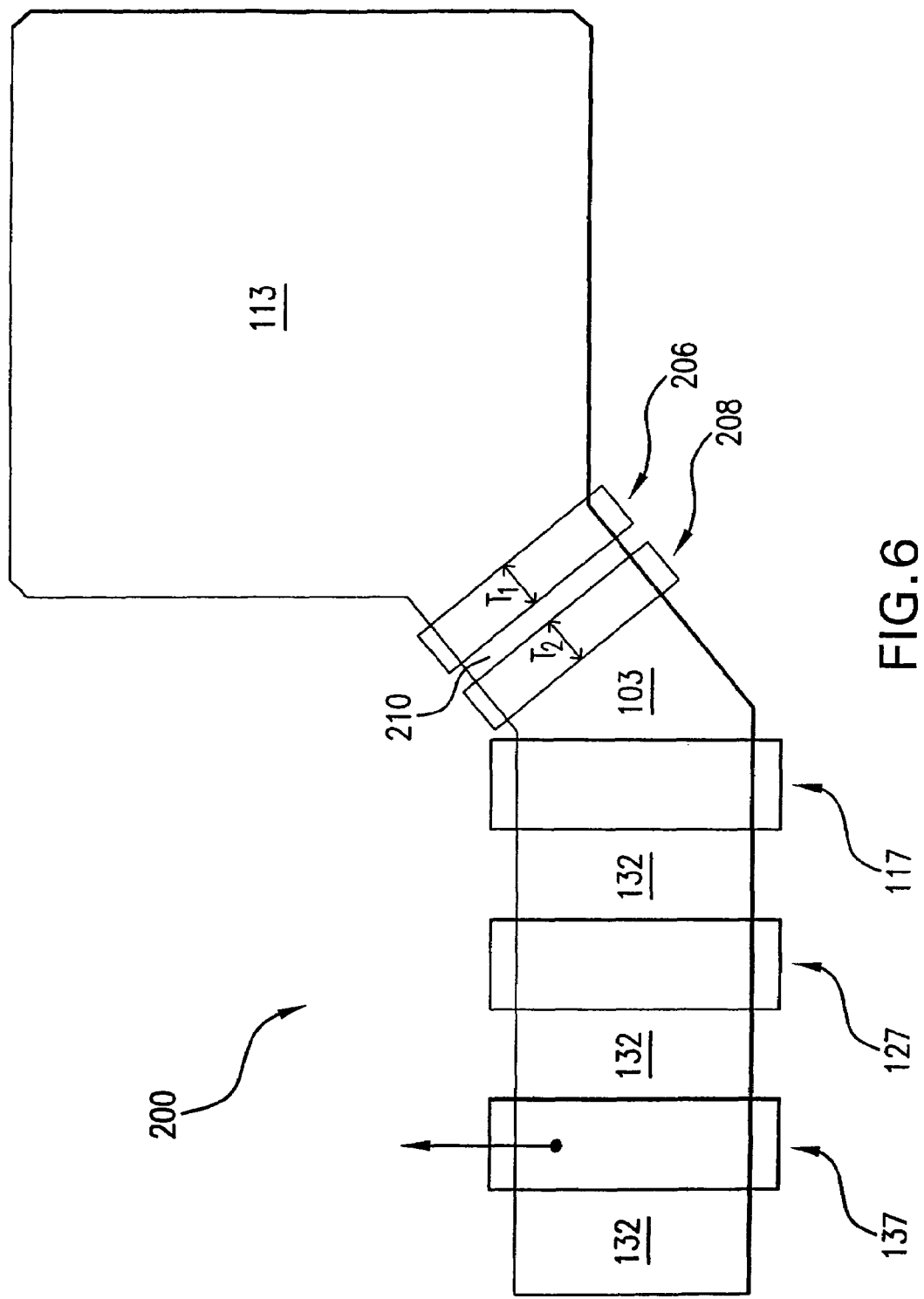

SPLIT TRANSFER GATE FOR DARK CURRENT SUPPRESSION AN IMAGER PIXEL

The present application is a divisional of application Ser. No. 11/019,232, filed Dec. 23, 2004, the entire disclosure of which is incorporated herein by reference.

FIELD OF THE INVENTION

The present invention relates generally to semiconductor devices, and more particularly, to transfer transistor technology, for use in imager pixels.

BACKGROUND OF THE INVENTION

CMOS image sensors are increasingly being used as low cost imaging devices. A CMOS image sensor circuit includes a focal plane array of pixel cells, each one of the cells includes a photosensor, such as e.g., a photogate, photoconductor, or photodiode having an associated charge accumulation region within a substrate for accumulating photo-generated charge. Each pixel cell may include a transistor for transferring charge from the charge accumulation region to a sensing node, and a transistor for resetting the sensing node to a predetermined charge level prior to charge transference. The pixel cell may also include a source follower transistor for receiving and amplifying charge from the sensing node and an access transistor, for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the sensing node accompanied by charge amplification; (4) resetting the sensing node to a known state before the transfer of charge to it; (5) selection of a pixel for readout; and (6) output and amplification of a signal representing pixel charge from the sensing node.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,177,333 and 6,204,524, which describe the operation of conventional CMOS image sensors and are assigned to Micron Technology, Inc., the contents of which are incorporated herein by reference.

A top-down view of a conventional CMOS pixel cell 10 is shown in FIG. 1. The illustrated CMOS pixel cell 10 is a four transistor (4T) cell. The CMOS pixel cell 10 generally comprises a photo-conversion device 13, e.g., a photodiode, for generating and collecting charge in response to light incident on the pixel cell 10, and a transfer transistor having a gate 7 for transferring photoelectric charges from the photo-conversion device 13 to a sensing node, which is typically a floating diffusion region 3. The floating diffusion region 3 is electrically connected to the gate 27 of an output source follower transistor. The pixel cell 10 also includes a reset transistor having a gate 17 for resetting the floating diffusion region 3 to a predetermined voltage; and a row select transistor having a gate 37 for outputting a signal from the source follower transistor 27 to an output terminal in response to an address signal on gate 37.

FIG. 2 is a cross-sectional view of a portion of the pixel cell 10 of FIG. 1, taken along line 2-2', showing the photo-conversion device 13 constructed as a photodiode, transfer transistor having a gate 7 and reset transistor having a gate 17. The CMOS pixel cell 10 has a photo-conversion device 13 that may be formed as a pinned photodiode. The illustrated photodiode has a p-n-p construction comprising a p-type surface layer 5 and an n-type photodiode charge collection region 14 within a p-type substrate 2. The photodiode 13 is adjacent to and partially underneath the gate 7 of the transfer transistor. The reset transistor gate 17 is on a side of the transfer transistor gate 7 opposite the photodiode 13. As shown in FIG. 2, the reset transistor includes a source/drain region 32, which is adjacent an isolation region 9. The floating diffusion region 3 is located between the gates 7, 17 of the transfer and reset transistor.

In the CMOS pixel cell 10 depicted in FIGS. 1 and 2, electrons are generated by light incident on the photodiode 13 and are stored in the n-type photodiode region 14. These charges are transferred to the floating diffusion region 3 by the transfer transistor when the transfer transistor gate 7 is turned on. The source follower transistor produces an output signal from the transferred charges which are stored in the floating diffusion region 3.

One common problem associated with conventional imager pixel cells, such as pixel cell 10, is dark current, that is, current generated as a photodiode signal in the absence of light. Dark current may be caused by many different factors, including: photodiode junction leakage, leakage along isolation edges, transistor sub-threshold leakage, drain induced barrier lower leakage, gate induced drain leakage, trap assisted tunneling, and pixel fabrication defects. One example of a defect is an interstitial vacancy state in the charge carrier-depletion region. This defect causes increased thermal generation of electron-hole pairs, which may be collected in the photodiode 13 (FIG. 2) and effectively lower overall image quality.

The area directly under the edge of the transfer transistor gatestack 17 is a significant source of dark current. The n-type accumulation region 14 of photodiode 13 is formed close to the surface of the substrate 2 under the transfer gatestack 17 in order to reduce charge lag. This causes the depletion region created during an integration period for the pixel cell 10, and being associated with the n-type accumulation region 14 and the p-type surface region 5, to also be close to the surface of the substrate 2 in this area. The presence of the depletion region in an area that already has defects causes large numbers of thermally-created electron-hole pairs to be present in this area near the transfer transistor gatestack 17 edge. When the photodiode 13 is reset with a reset voltage applied on the reset gate 17, a reverse bias electric field sweeps the thermally created holes into the p-type surface region 5 and the thermally created charge carriers over to the n-type collection area 14 of the photodiode 13. These thermally generated charge carriers increase the unwanted dark current for image pixel cell 10.

One possible solution to reducing the dark current generation underneath the transfer transistor gatestack is to apply a negative voltage on the transfer transistor's gate. The negative voltage attracts electron-hole pairs to the surface, decreasing the depletion region there and effectively covering the interstitial vacancy state. Accordingly, with a negative voltage applied to the transfer transistor gate, thermally generated electron-hole pairs will likely recombine before the photodiode can collect them. This solution, however, tends to aggravate another problem, referred to as blooming. Blooming occurs when the storage capacity of the photodiode is full and electrons are still being generated even though the photodiode is full. The extra electrons can bloom to several locations. The extra electrons may attempt to diffuse by jumping across isolation barriers into adjacent pixels, corrupting their signals. Alternatively, the electrons may travel through the substrate and be collected in other areas of the pixel or in periphery circuit devices. The floating diffusion region is the most desirable place for the extra electrons to be collected. The floating diffusion region has considerable capacity to store these stray electrons during imager operation and the signal on the floating diffusion region is cleared or reset before the pixel signal is actually read.

Positively biasing the transfer transistor gate 7 makes extra electrons more likely to bloom through the transfer transistor to the floating diffusion region 3. However, applying a negative bias to the transfer transistor gate 7, which is desirable to prevent dark current penetration, makes it more difficult for the extra electrons to bloom to the floating diffusion region 3, thus causing blooming into other undesirable regions of a pixel or adjacent pixels. Moreover, as suggested above, a positively biased transfer transistor gate 7 increases the dark current as a result of a larger depletion region under the transfer transistor gate 7.

Therefore, a pixel having a decreased dark current without negative blooming effects is desired. Also needed is a simple method of fabricating and operating such a pixel.

BRIEF SUMMARY OF THE INVENTION

The present invention, as described in various exemplary embodiments, provides a pixel with a transfer transistor having a split transfer gate. A first section of the transfer gate is connectable to a first voltage source while a second section of the transfer gate is connectable to a second voltage source. Thus, during a charge integration period of a photosensor, the two sections of the transfer gate may be oppositely biased to decrease dark current while controlling blooming of electrons within and out of the pixel. During charge transfer the two gate sections may be commonly connected to a positive voltage sufficient to transfer charge from the photosensor to a floating diffusion region.

In accordance with one exemplary embodiment of the invention, the first and second gate sections are located adjacent one another, over a gate oxide layer, and are separated by an isolation region.

BRIEF DESCRIPTION OF THE DRAWINGS

The foregoing and other aspects of the invention will be better understood from the following detailed description of the invention, which is provided in connection with the accompanying drawings, in which:

FIG. 6 is a top-down view of a pixel cell constructed in accordance with a second exemplary embodiment of the invention;

DETAILED DESCRIPTION OF THE INVENTION

Figure 1:
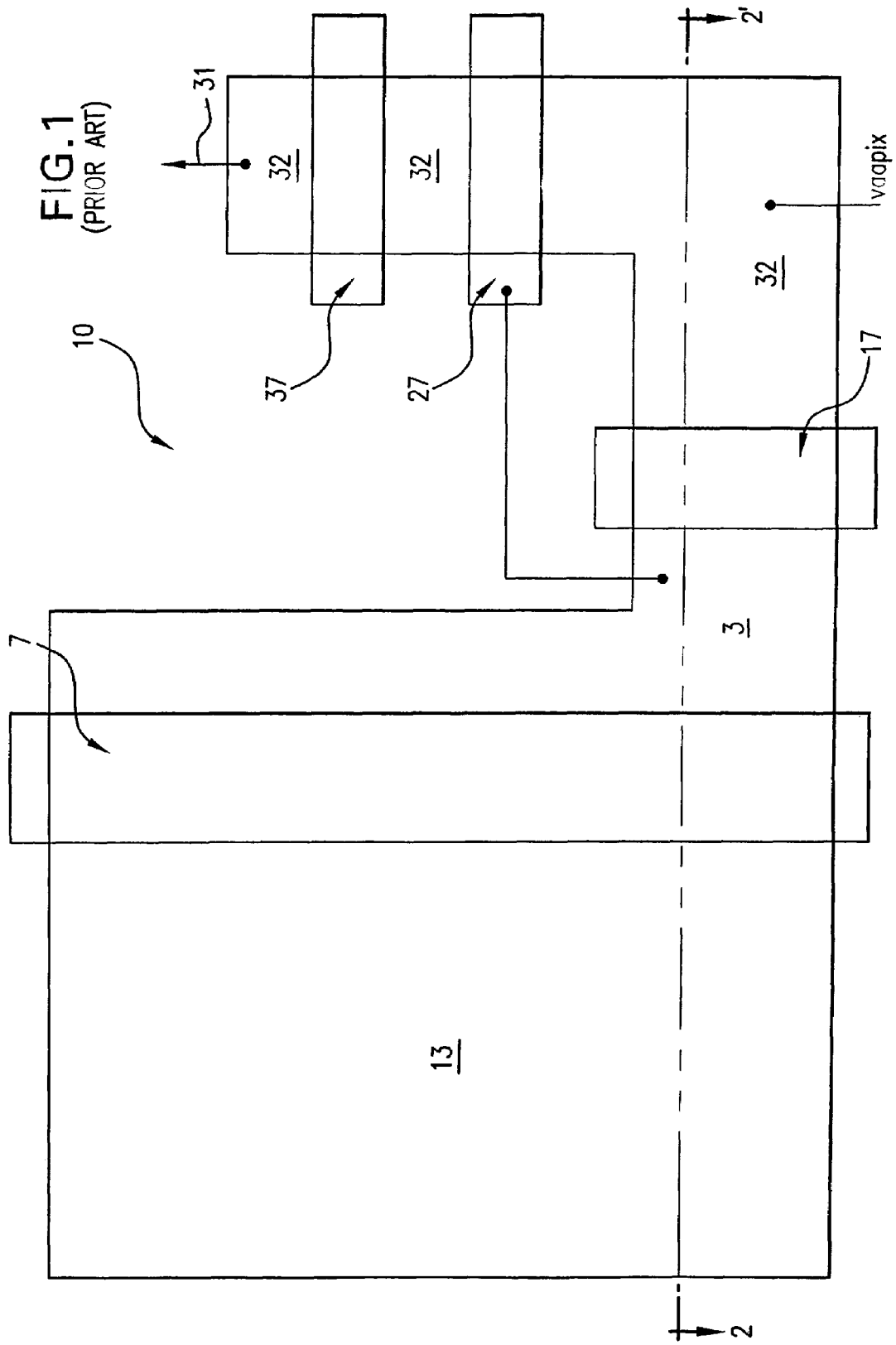
FIG. 1 is a top-down view of a conventional four transistor (4T) pixel cell.
Figure 2:
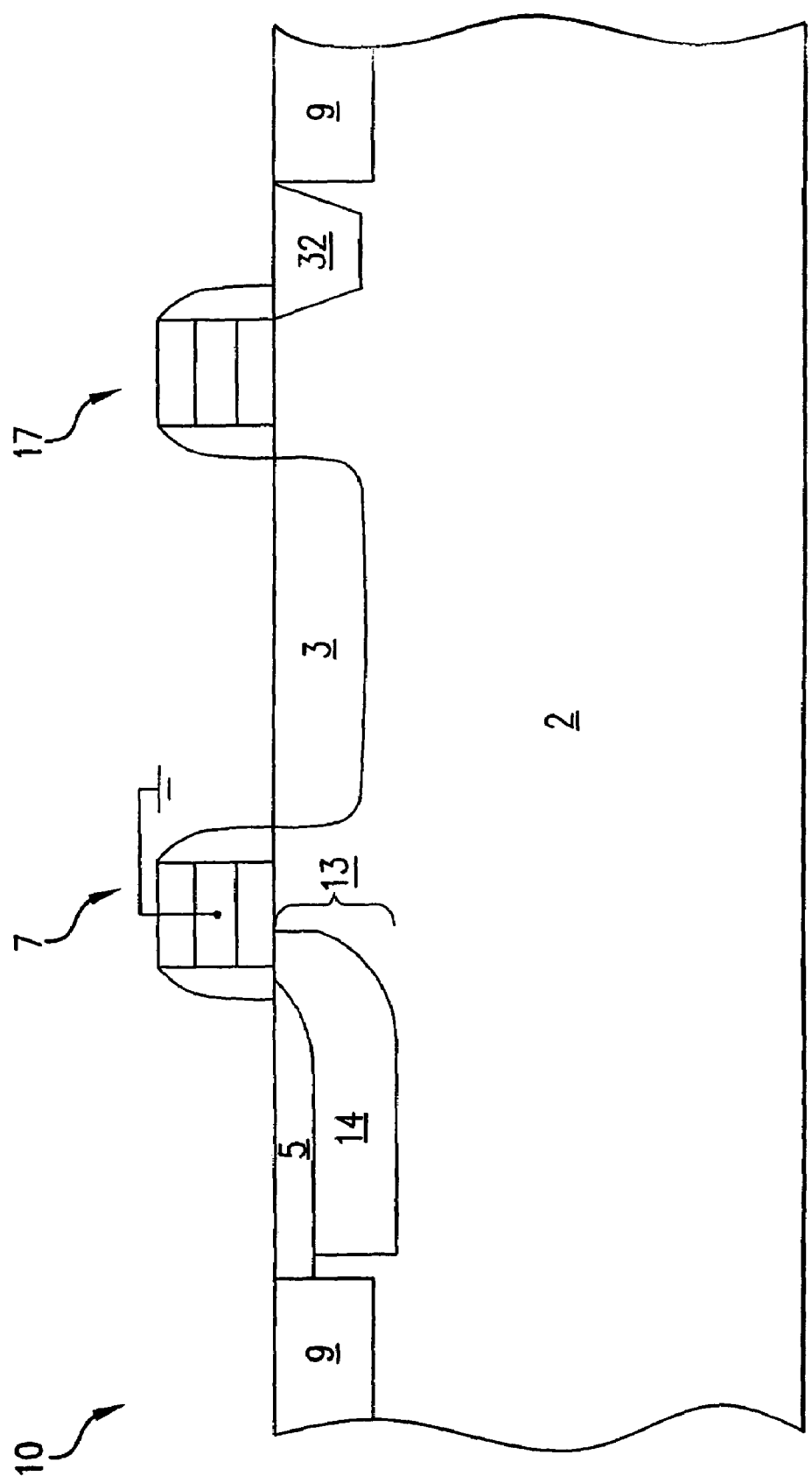
FIG. 2 is a cross-sectional view of the pixel cell of FIG. 1 taken along line 2-2'.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), silicon-on-sapphire (SOS), and silicon-on-nothing (SON) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device and transistors for converting electromagnetic radiation to an electrical signal. For purposes of illustration, a portion of a representative pixel cell is illustrated in the figures and description herein, and typically fabrication of all pixel cells in an image sensor will proceed concurrently and in a similar fashion.

Figure 3:
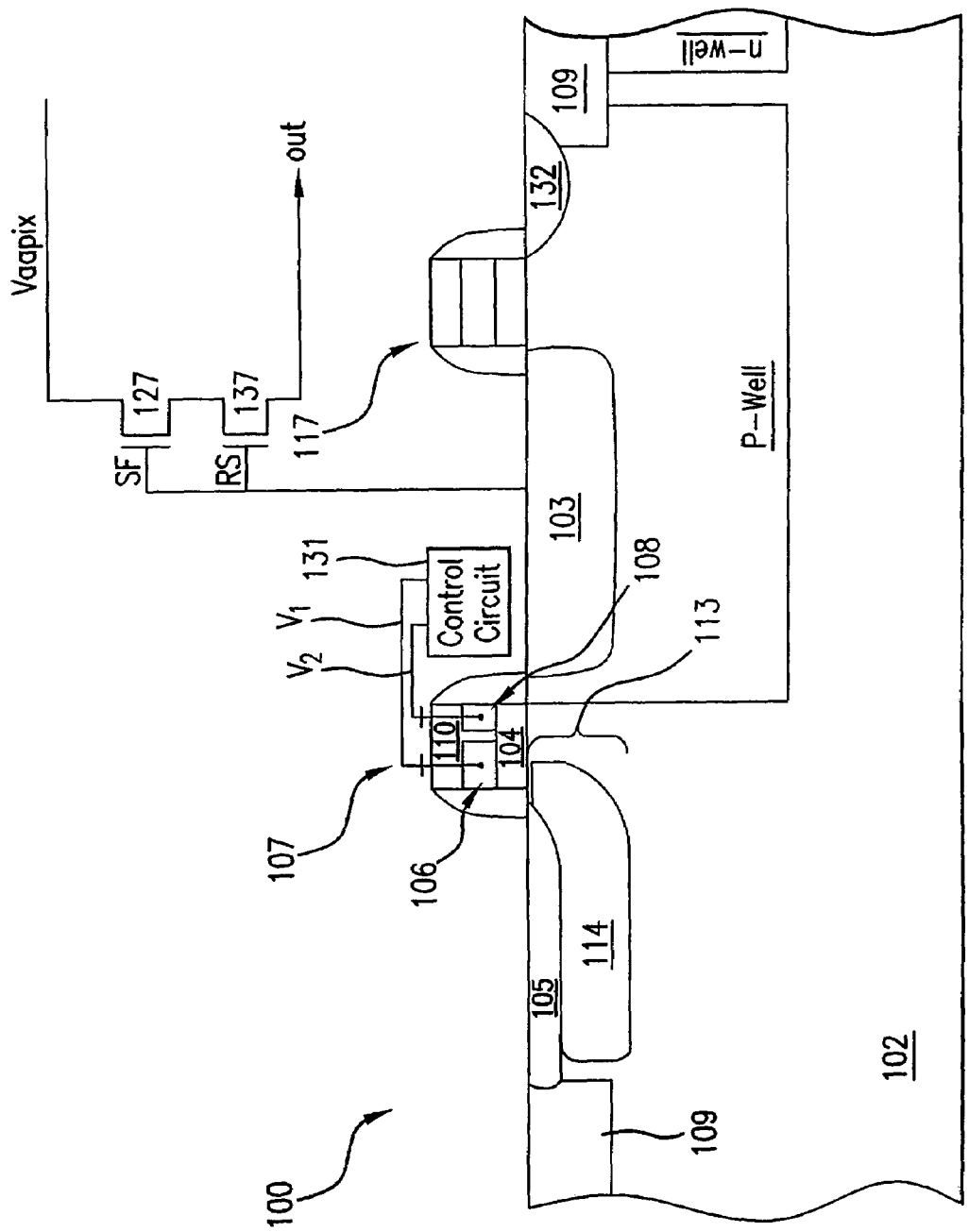
FIG. 3 is a cross-sectional view of a first exemplary embodiment of a pixel cell constructed in accordance with the invention.

FIG. 3 is a cross-sectional and partial schematic circuit view of a pixel cell 100 according to an exemplary embodiment of the invention. The pixel cell 100 has a split transfer gate electrode, having two-sections 106, 108, as a part of transfer transistor 107. As shown, both of the two sections 106, 108 of the transfer gate electrode are located above a gate oxide layer 104 and beneath an insulating cap layer 110. During imager use, the two sections 106, 108 of the gate electrode may be respectively connected to a control circuit 131 for controlling the application of a respective first and second voltage potential $V_1$, $V_2$.

In the exemplary pixel cell 100, the transfer gate of the transfer transistor 107 is located between a photodiode 113 and a floating diffusion region 103. The photodiode 113 is illustratively a p-n-p photodiode, comprising a p-type surface region 105 located over an n-type accumulation region 114, in a p-type substrate 102. The invention may also be utilized, however, with other photosensitive elements and is not limited to the layout of the illustrated photodiode 113.

The transfer transistor 107 acts to transfer accumulated photo-charges from the n-type accumulation region 114 to the floating diffusion region 103. A reset transistor 117 is located on an opposite side of the floating diffusion region 103 from the transfer transistor 107. A source/drain region 132 is located in the substrate 102 on a second side of the reset transistor 117 and is capable of receiving a supply voltage $V_{aa\text{-}pix}$. Adjacent the source drain region is a shallow trench isolation (STI) region 109. A similar STI region 109 is constructed on the other side of the pixel cell as well, adjacent the photodiode region 113 to provide isolation for the pixel cell 100. The floating diffusion region 103 is also electrically connected to the gate of a source follower transistor 127 having a drain coupled to $V_{aa\text{-}pix}$, which creates a voltage signal based on stored charge on the floating diffusion region 103. A row select transistor 137 has a drain connected to the source of the source follower transistor 127 for selectively reading out the pixel signal to a column line.

Figure 4:
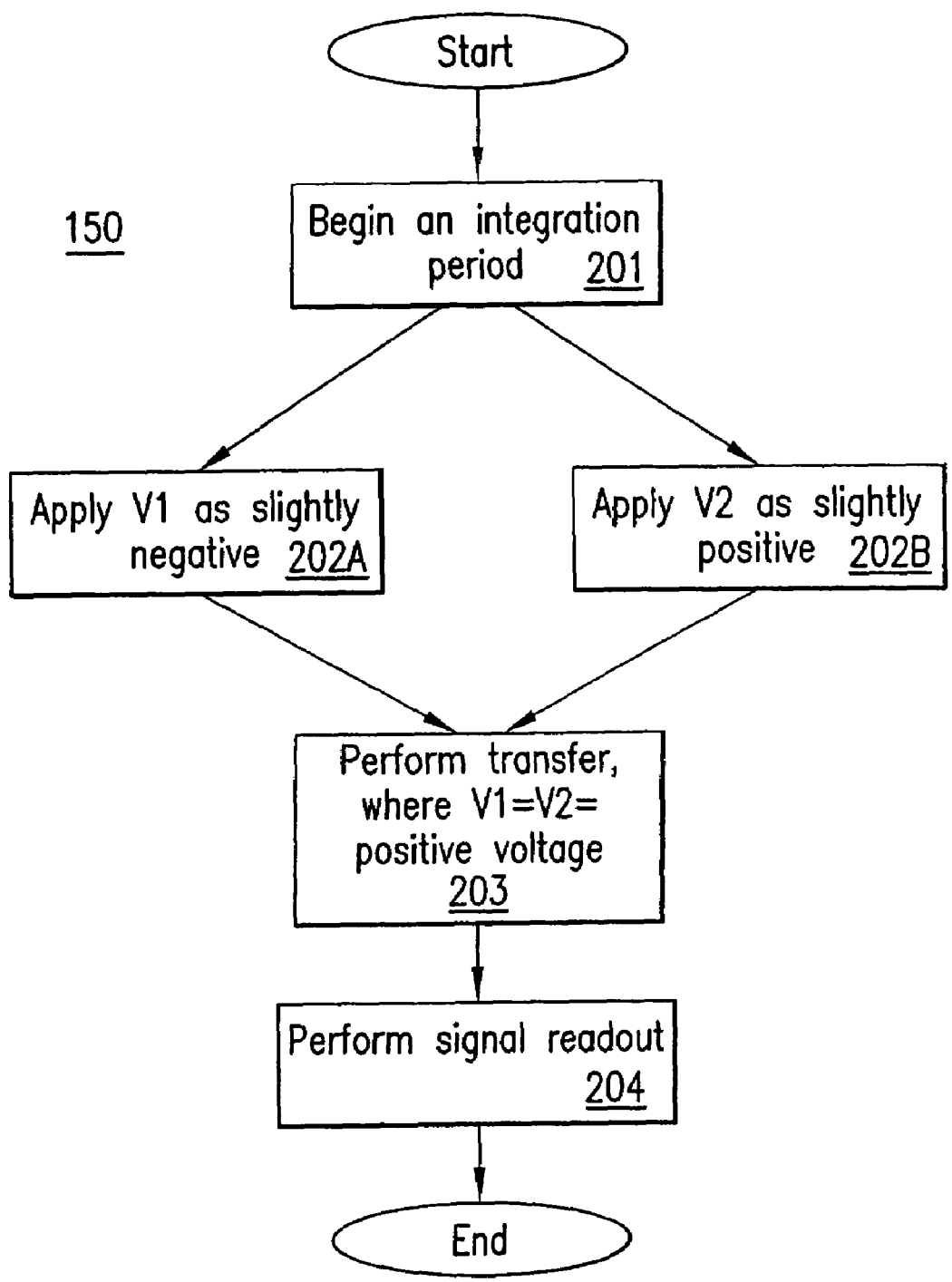
FIG. 4 is a diagram depicting a method of operating an exemplary pixel cell in accordance with the invention.

FIG. 4 illustrates an exemplary method 150 of operating the exemplary pixel cell 100. An integration period begins at step 201 as light is applied to the pixel cell 100 to capture an image. This can be done using any known method for beginning an integration period, such as the use of a mechanical or electronic shutter. As shown in steps 202A and 202B during the integration period, the control circuit 131 (FIG. 3) applies a first voltage $V_1$ to a terminal at the first section 106 of the transfer gate electrode, and a second voltage $V_2$ is applied to a terminal at the second section 108 of the transfer gate electrode. In accordance with a preferred embodiment of the invention, the first voltage $V_1$ is a slightly negative voltage so that the depletion region is pulled away from the surface of the silicon near the edge of the transfer gate of transfer transistor 107 (FIG. 3). The first voltage $V_1$ may be in the range of about −0.1 to about −1.0 volts. At the same time (202B), a slightly positive voltage $V_2$ is applied to the second section 108 of the transfer transistor gate electrode. The slightly positive-biased second section 108 acts to attract mobile electrons under the transistor gate and serves to create a path for electrons, which might otherwise cause blooming, to flow to the floating diffusion region 103, rather than to undesired areas of pixel 100 or to adjacent pixels. The second voltage $V_2$ may be in the range of about +0.1 to about +1.0 volts.

Next, for performing charge transfer, at step 203, both sections 106, 108 of the gate electrode are biased with the same, positive voltage in order to turn on the transfer transistor to transfer the generated charges from the accumulation region 114 to the floating diffusion region 103. Thus during charge transfer, the transfer transistor 107 acts as one gatestack; in contrast with during an integration period, when the transfer transistor 107 acts as though it has two separately controlled gatestacks. In step 204, charges transferred to floating diffusion region 103 are applied to the gate of source follower transistor 127 which produces a pixel output signal that is read out through row select transistor 137.

Figure 5A:
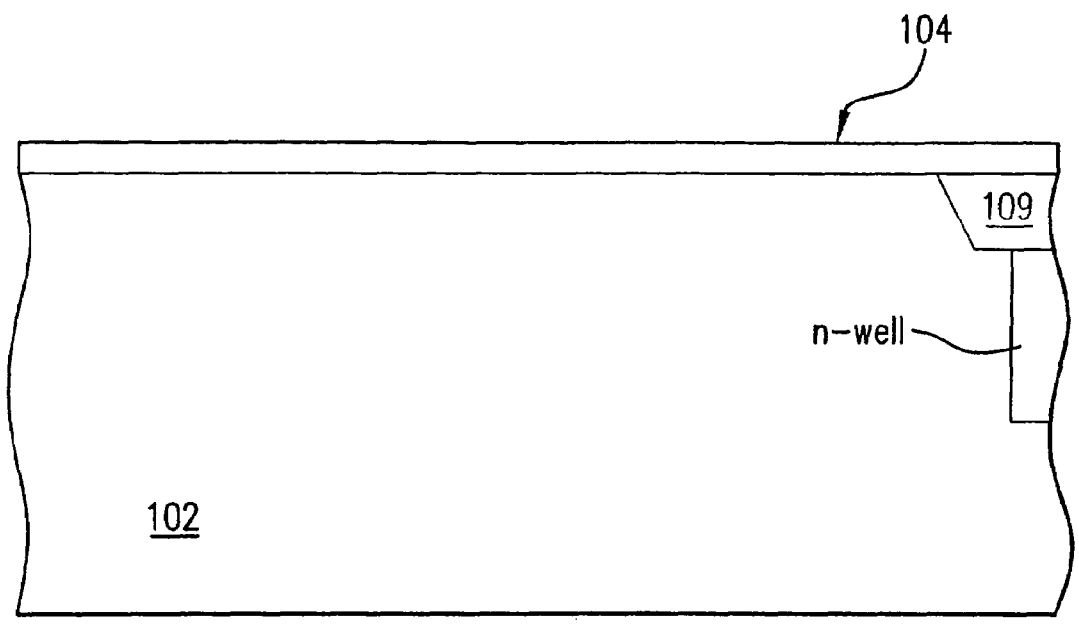
FIG. 5A is a cross-sectional view of portions of the exemplary pixel cell of FIG. 3 at an initial stage of fabrication.
Figure 5B:
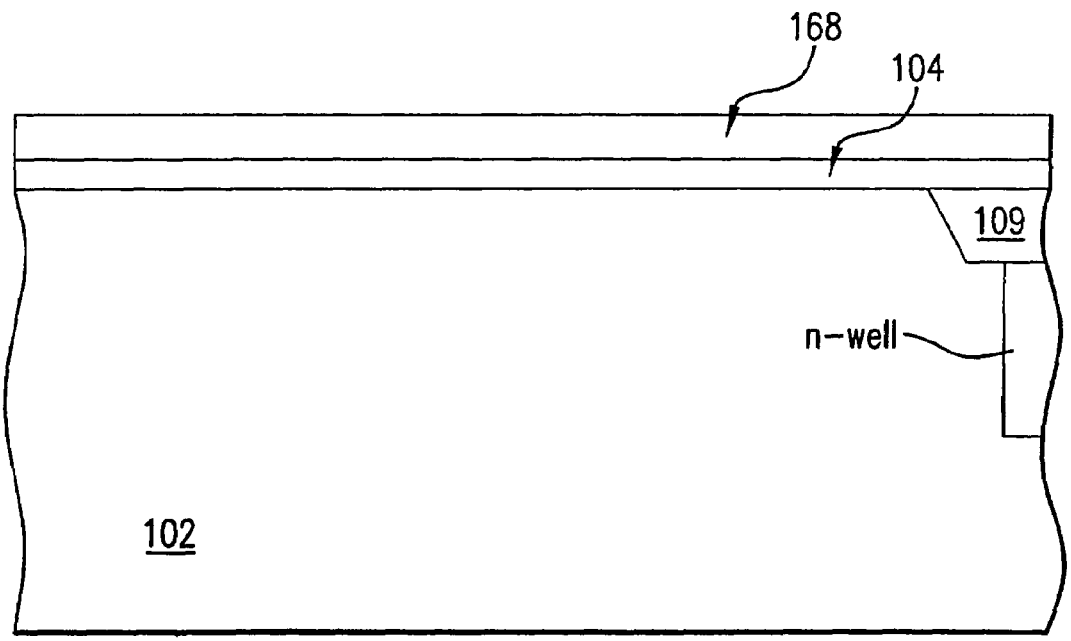
FIG. 5B is a cross-sectional view of portions of the exemplary pixel cell of FIG. 3 at a stage of fabrication subsequent to FIG. 5A.
Figure 5C:
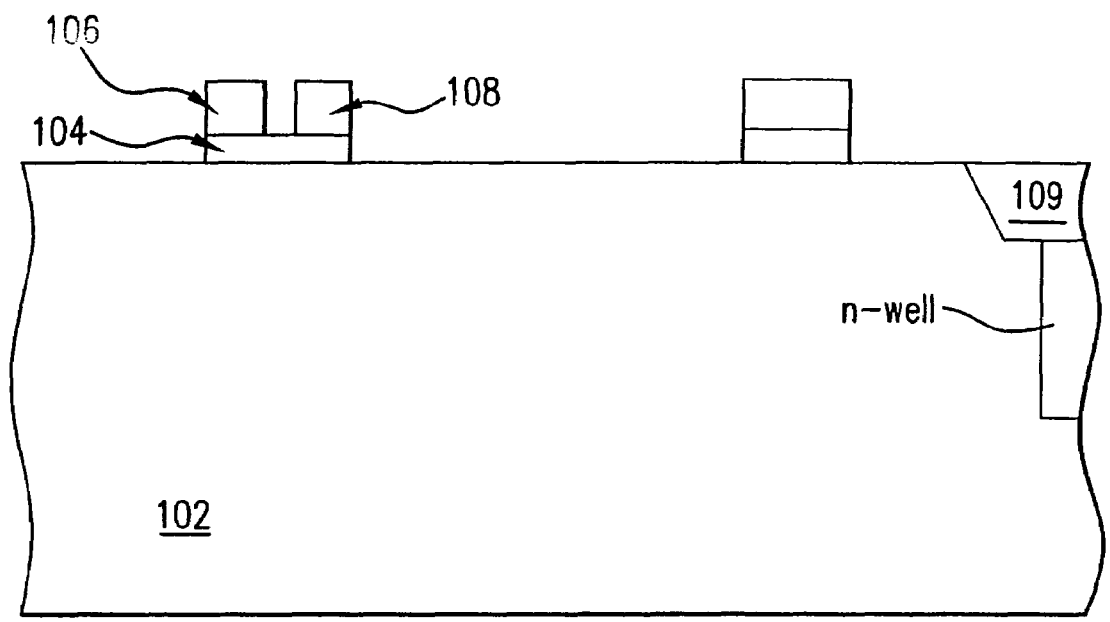
FIG. 5C is a cross-sectional view of portions of the exemplary pixel cell of FIG. 3 at a stage of fabrication subsequent to FIG. 5B.

FIGS. 5A-5F depict one exemplary method of making a pixel cell 100 in accordance with the present invention, showing a cross-sectional view of part of pixel cell 100. With reference to FIG. 5A, an isolation region 109 is formed at least partially in an n-well region of a substrate 102. The isolation region 109 may be formed using any known isolation forming techniques such as STI or LOCOS. At a top surface of the substrate 102, a layer of gate oxide material 104 is deposited. The gate oxide material 104 may be any suitable dielectric material, such as, for example, silicon dioxide. Next, as shown in FIG. 5B, a conductive layer 168 is formed over the gate oxide layer 104. The conductive layer 168 material may be any type of suitable electrode material, such as doped polysilicon. A photoresist mask/etch step is next performed to eliminate the gate oxide and conductive material everywhere except for the area where the gatestacks for transistors (107, 117) are to be formed. A second mask/etch step may then be performed so that the conductive layer 168 for the transfer transistor 107 gatestack is split into a first 106 and a second 108 section, as shown in FIG. 5C.

Figure 5D:
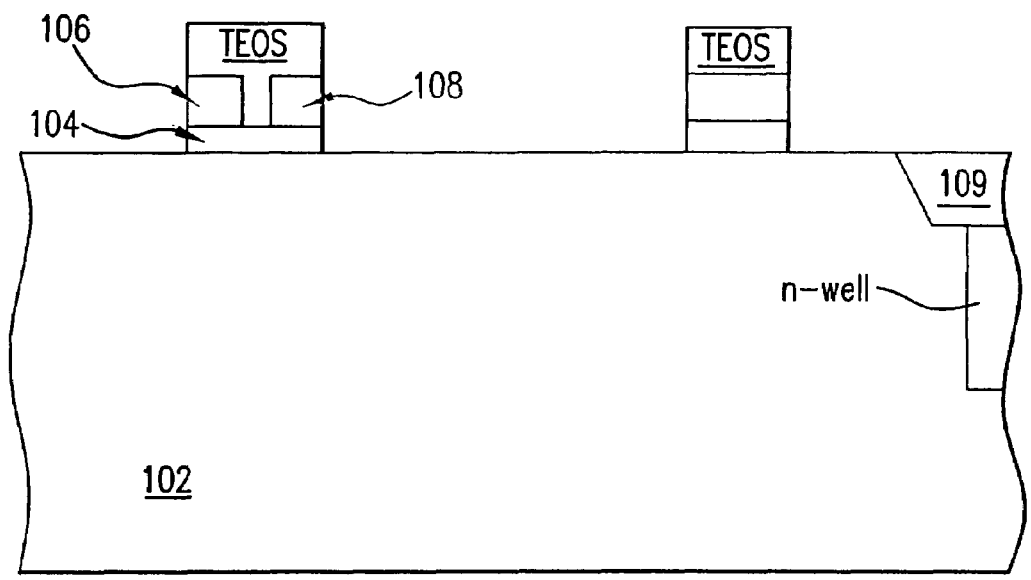
FIG. 5D is a cross-sectional view of portions of the exemplary pixel cell of FIG. 3 at a stage of fabrication subsequent to FIG. 5C.
Figure 5E:
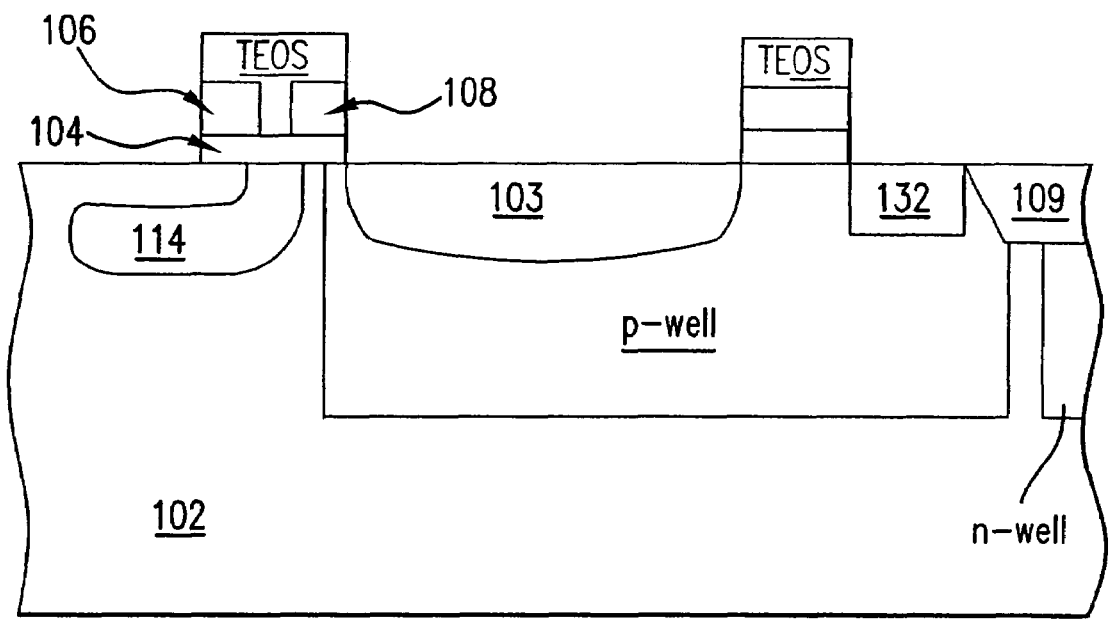
FIG. 5E is a cross-sectional view of portions of the exemplary pixel cell of FIG. 3 at a stage of fabrication subsequent to FIG. 5D.

An insulating material, such as a tetraethyl orthosilicate ("TEOS") layer is formed over the surface of the substrate 102 and gatestacks. With reference to FIG. 5D, a photoresist mask/etch step is performed to eliminate the TEOS layer everywhere except over the gatestacks. In order to reduce the resistance between the electrode sections 106, 108, an implant of phosphorus ions into the TEOS isolation region 110 between the gate electrode sections 106, 108 may be used. An implant dose of $2e^{12}$ atoms per $cm^3$ may be sufficient depending on the type of materials used and the spacing between the electrode sections 106, 108. Next, as shown in FIG. 5E, masked ion implants are selectively introduced into the substrate to form a large p-well. Appropriate ion implants are then utilized to form an n-type accumulation region 114 on one side of the transfer transistor 107, and an n-type diffusion region 103 on the other side. An n-type source drain region 132 is also created near the surface of the substrate 102 for the reset transistor.

Figure 5F:
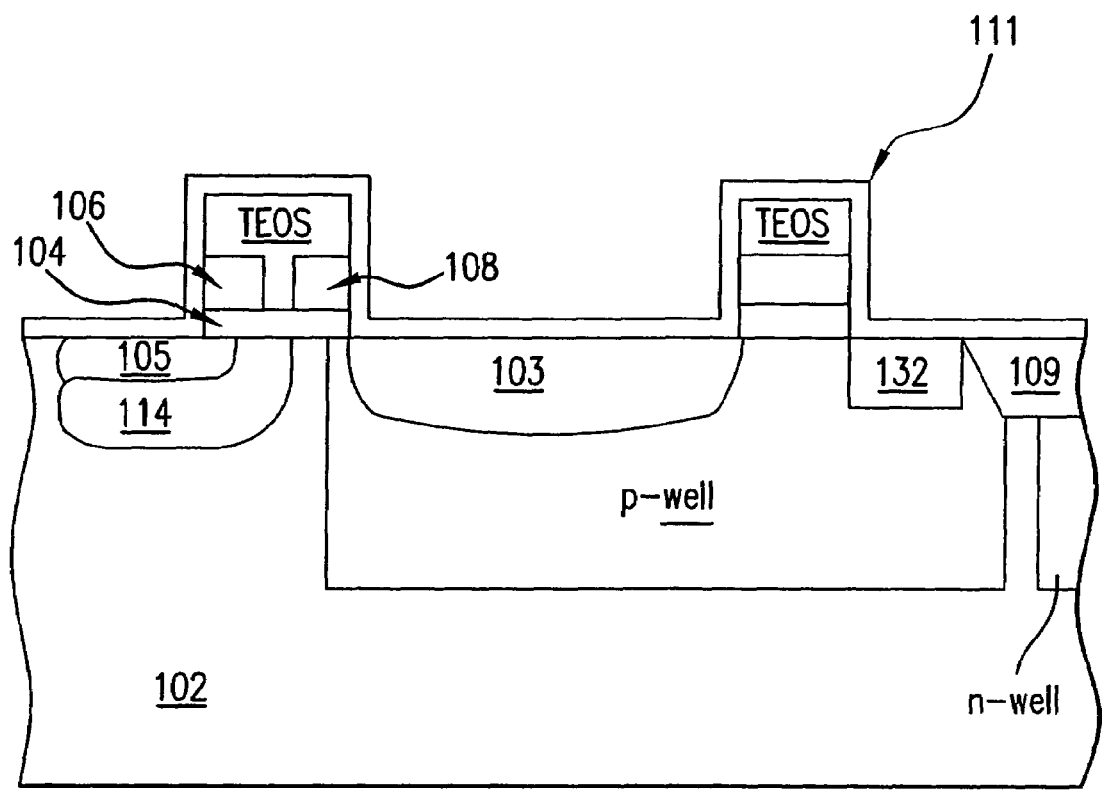
FIG. 5F is a cross-sectional view of portions of the exemplary pixel cell of FIG. 3 at a stage of fabrication subsequent to FIG. 5E.

Turning to FIG. 5F, a surface p-type region 105 is created by implanting ions into the area of the substrate 102 over the accumulation region 114. An oxide layer 111 is formed over the top of the substrate 102, thereby creating oxide spacers on each transistor gatestack which may be etched away except at the sides and top of the transistor gatestacks. At this stage, the pixel cell 100 is essentially complete. Additional processing steps may be used to form insulating, photo device shielding, and light shielding layers, as desired. For example, a BPSG layer may be formed over the FIG. 5F structure, upon which ILD and metallization layers are formed as known in the art.

FIGS. 6-9 show top-down views of pixel cells 200, 300, 400, and 500 in accordance with other exemplary embodiments of the invention. The only difference between these alternative embodiments and the first exemplary embodiment of pixel cell 100 is the location and arrangement of the transfer transistor. FIG. 6 shows a second exemplary pixel cell 200, which has two distinct electrode regions 206, 208 separated by an isolation region 210. Each electrode section 206, 208 being located at an angle relative to the photodiode 113, but parallel to one another. In accordance with one design of this second exemplary embodiment, the first electrode section 206 is thicker in width than the second electrode section as shown by the relative thicknesses $T_1$ and $T_2$. For example, the first electrode section may be approximately 0.3 microns wide and spaced apart from the second electrode section 208 by 0.2 microns. The second electrode section 208 may be approximately 0.2 microns wide in this exemplary embodiment.

Figure 7:
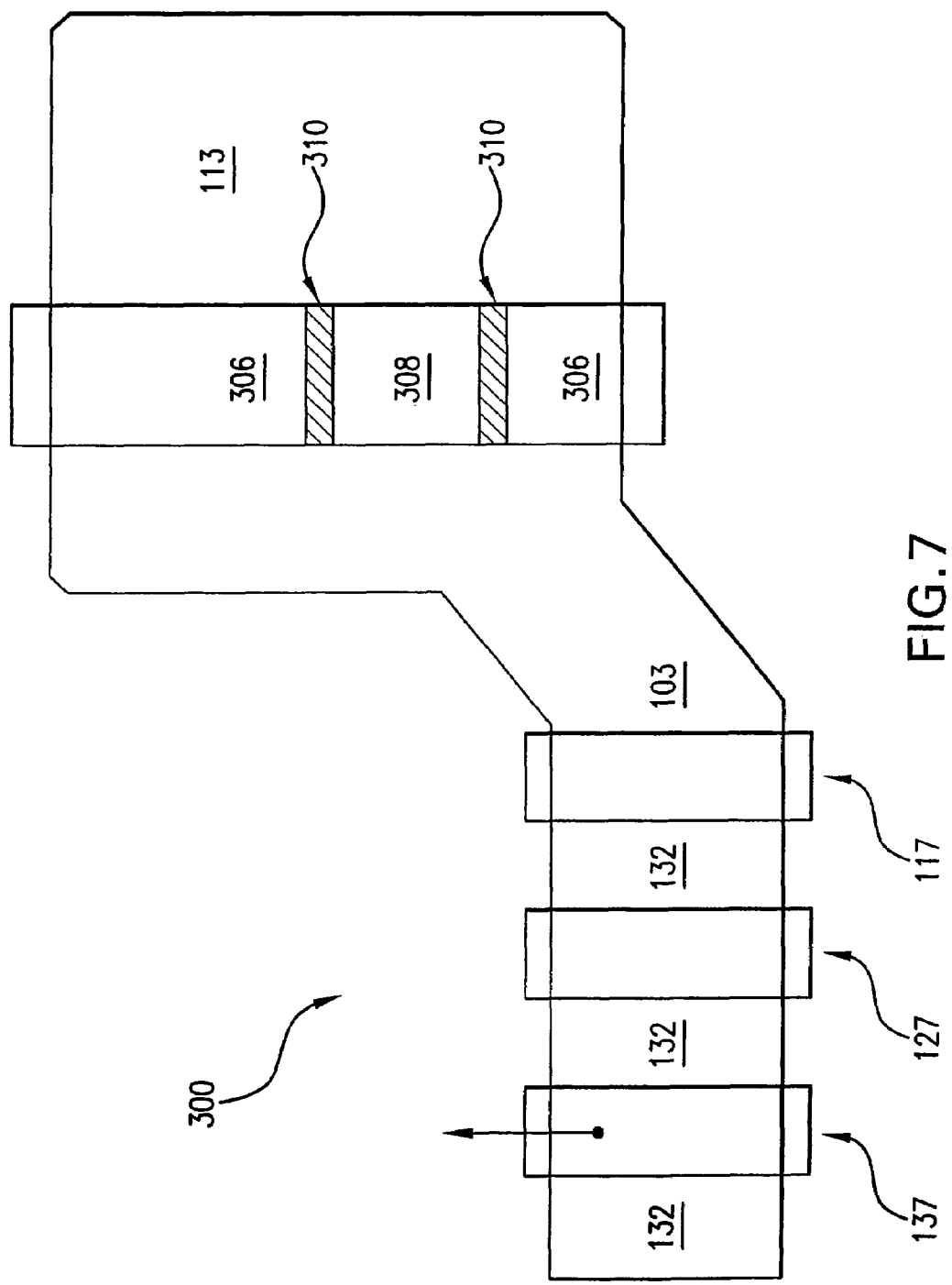
FIG. 7 is a top-down view of a pixel cell constructed in accordance with a third exemplary embodiment of the invention.

FIG. 7 shows an exemplary pixel cell 300 constructed in accordance with a third exemplary embodiment. Pixel cell 300 has a first electrode section 306 adapted for connection to one voltage source separated by isolation regions 310 from a second electrode section 308 for connection to a second voltage source. In this embodiment, the second electrode section 308 is sandwiched between the first section 306. Specifically, the second electrode section 308 has the same width as the first electrode section 306 and effectively creates three electrode sections, two sections 306 connectable to a first voltage source, and the third 308 connectable to a second voltage source. In operation of this exemplary pixel cell 300, the edges of the transfer gate (first electrode section 306) are negatively biased to clear out generation of dark current from the area in the photodiode region 113 near the edge of the transfer gatestack edge, where it can be the most problematic. The middle of the transfer gatestack is the second electrode section 308 which is adapted to receive a positive voltage to provide blooming protection for electrons out of the photodiode region 113.

Figure 8:
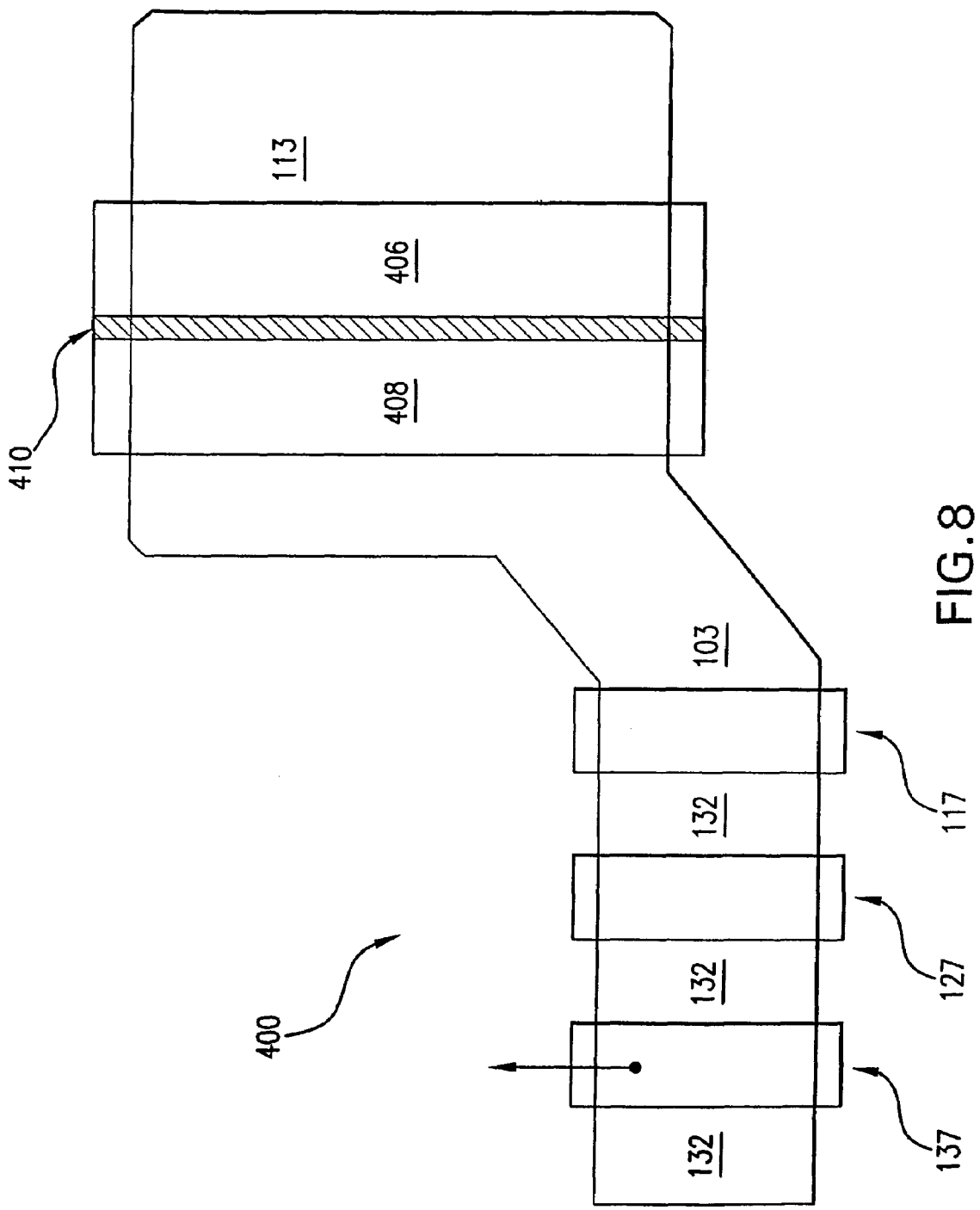
FIG. 8 is a top-down view of a pixel cell constructed in accordance with a fourth exemplary embodiment of the invention.
Figure 9:
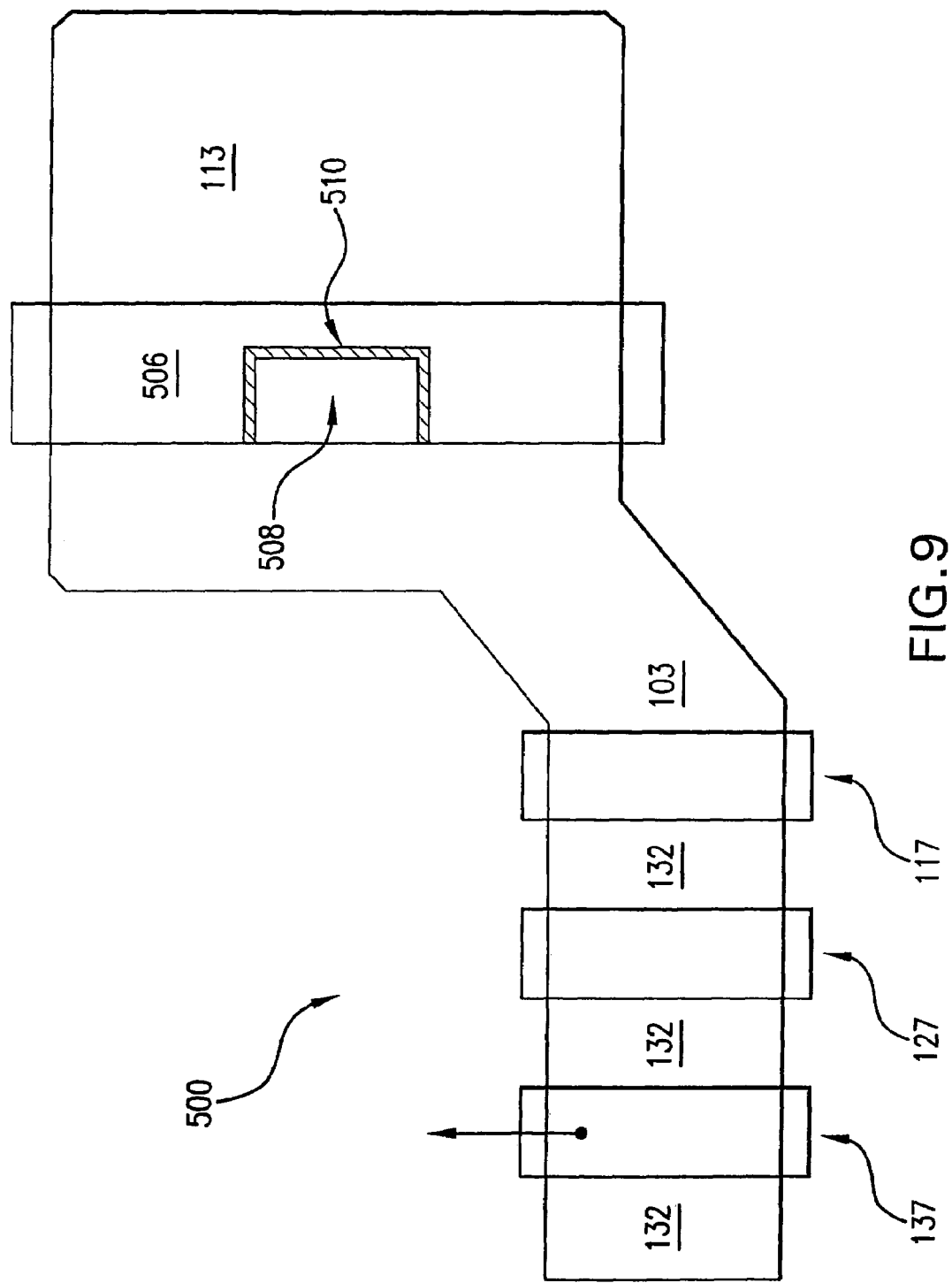
FIG. 9 is a top-down view of a pixel cell constructed in accordance with a fifth exemplary embodiment of the invention.

FIG. 8 shows a fourth exemplary embodiment of a pixel cell 400 which has two electrode sections 406, 408, running parallel to one another along the length of the photodiode region 113. The two electrode sections 406, 408 of this embodiment are separated by an isolation region 410. Finally, a fifth exemplary embodiment of a pixel cell 500 is shown in FIG. 9. Pixel cell 500 has a second electrode section 508 within the first electrode section 506, again separated by a thin isolation region 510. Unlike the third exemplary embodiment of this invention, however, the width of this second electrode section 508 is less than the width of the first electrode section 506.

The second through fifth exemplary embodiments of the invention are constructed using similar fabrication steps discussed above with reference to FIGS. 5A-5F. Also similar to the exemplary pixel cell 100 above, the electrode sections for the split transfer gate electrodes for the second through fifth exemplary cells may be formed of any materials known in the art of transistor fabrication. Preferably, phosphorus ion implants are utilized in the isolation regions 210, 310, 410, 510 to increase the performance of the gates.

Figure 10:
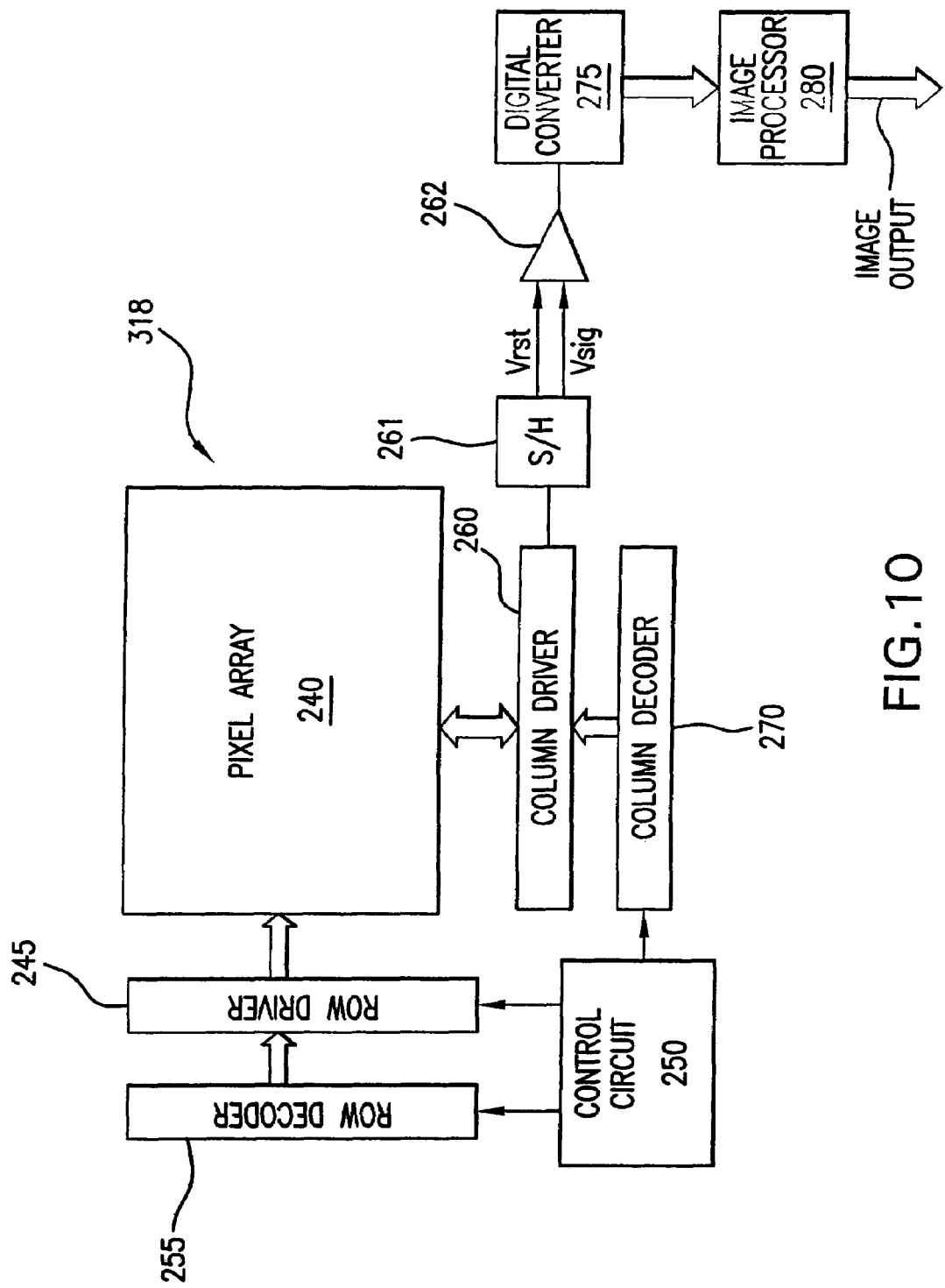
FIG. 10 is a block diagram of a CMOS image sensor according to an exemplary embodiment of the invention.

The exemplary pixels of the present invention can be used in a pixel array 240 of an imager device 318 as shown in FIG. 10. A pixel array 240 comprises a plurality of pixels arranged in a predetermined number of columns and rows, with each pixel cell being constructed in accordance with one of the exemplary embodiments described above. Connected to the array 240 is signal processing circuitry, at least part of which may be formed in the substrate. The pixels of each row in array 240 are all turned on at the same time by a row select line, and the pixels of each row are selectively output by respective column select lines. A plurality of row and column lines are provided for the entire array 240. The row lines are selectively activated by a row driver 245 in response to row address decoder 255. The column select lines are selectively activated by a column driver 260 in response to column address decoder 270. Thus, a row and column address is provided for each pixel.

The CMOS imager 318 is operated by a timing and control circuit 250, which controls address decoders 255, 270 for selecting the appropriate row and column lines for pixel readout. The control circuit 250 also controls the row and column driver circuitry 245, 260 such that they apply driving voltages to the drive transistors of the selected row and column lines. The pixel column signals, which typically include a pixel reset signal ($V_{rst}$) and a pixel image signal ($V_{sig}$), are read by a sample and hold circuit 261. $V_{rst}$ is read from a pixel 100 immediately after the charge storage region 103 (FIG. 3) is reset by the reset gate 117. $V_{sig}$ represents the amount of charges generated by the photosensitive element 113 in response to applied light to the pixel 100. A differential signal ($V_{rst}-V_{sig}$) is produced for each pixel by differential amplifier 262. The differential signal is digitized by analog-to-digital converter 275 (ADC). The analog-to-digital converter 275 supplies digitized pixel signals to an image processor 280, which forms and outputs a digital image.

Figure 11:
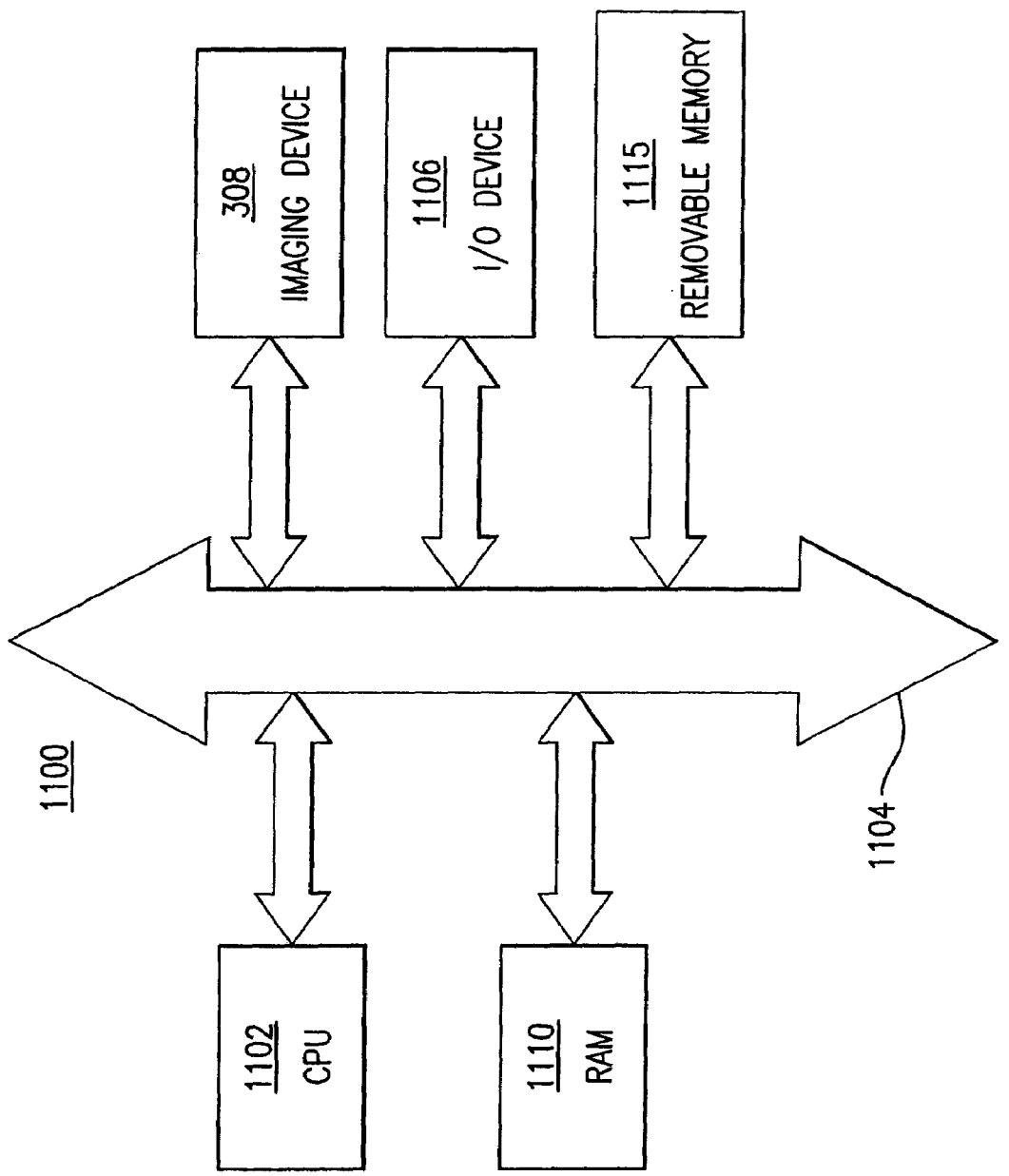
FIG. 11 is a diagram of a computer processor system incorporating an exemplary CMOS image sensor of the present invention.

FIG. 11 illustrates a processor-based system 1100 including an imaging device 318, which has pixels constructed in accordance with the embodiments described herein. For example, the pixels may be any of the exemplary pixel cells 100, 200, 300, 400, 500 constructed in accordance with the exemplary embodiments of the invention. The processor-based system 1100 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other digital imaging systems.

The processor-based system 1100, for example a camera system, generally comprises a central processing unit (CPU) 1102, such as a microprocessor, that communicates with an input/output (I/O) device 1106 over a bus 1104. Imaging device 318 also communicates with the CPU 1102 over the bus 1104. The processor-based system 1100 also includes random access memory (RAM) 1110, and can include removable memory 1115, such as flash memory, which also communicates with CPU 1102 over the bus 1104. Imaging device 308 may be combined with a processor, such as a CPU, digital signal processor, or microprocessor, with or without memory storage on a single integrated circuit or on a different chip than the processor. Any of the memory storage devices in the processor-based system 1100 could store software for employing the above-described method.

The above description and drawings are only to be considered illustrative of exemplary embodiments which achieve the features and advantages of the invention. Modification of, and substitutions to, specific process conditions and structures can be made without departing from the spirit and scope of the invention. Accordingly, the invention is not to be considered as being limited by the foregoing description and drawings, but is only limited by the scope of the appended claims.

The invention claimed is:

1. A method of forming a pixel cell comprising the acts of:
 forming a photosensitive region in a substrate for generating photo-charges;
 forming a storage region in the substrate for storing the photo-charges; and
 forming a transistor for transferring the charges from the photosensitive region to the storage region, comprising the acts of:
 forming a gate oxide layer at a surface of the substrate;
 forming first and second gate electrode sections over the gate oxide layer in a location between the photosensitive region and the storage region; and
 forming an isolation region between the first and second gate electrode sections to allow different applied voltages to control the transfer transistor.

2. The method of claim 1, further comprising the act of implanting ions into the isolation region.

3. The method of claim 2, wherein the act of implanting ions comprises implanting phosphorus ions.

4. The method of claim 3, wherein the ion concentration of the implanted phosphorus ions is approximately 2e12 atoms per cm3.

5. The method of claim 1, wherein the act of forming first and second gate electrodes comprises forming a conductive layer and selectively removing portions of the layer.

6. The method of claim 1, wherein the act of forming an isolation region between the first and second gate electrodes comprises forming a TEOS layer over and between the gate electrodes.

7. The method of claim 1, further comprising forming a circuit for applying a first and a second voltage respectively to the first and second gate electrode sections during an integration period for the cell.

8. The method of claim 7, wherein the circuit is adapted to apply a third voltage to both the first and second gate electrode sections during charge transfer.

9. A method of forming an imager circuit comprising the acts of:

forming a photosensitive area in a substrate;

forming a charge storage region in the substrate; and forming a transfer transistor having a gatestack for transferring charge from said photosensitive area to said charge storage region, said forming of said transfer transistor comprising the acts of:

forming first and second gate electrode sections located above the substrate; and forming an isolation region located between the first and second electrode sections to allow different applied voltages to control the transfer transistor; and forming a voltage supply circuit capable of supplying a first voltage to the first gate electrode section and a second different voltage to the second gate electrode section during a charge integration period.

10. The method of claim 9, further comprising:

forming said voltage supply circuit such that it supplies a third common voltage to said first and second gate electrode sections during a charge transfer period.

11. The method of claim 9, wherein forming a photosensitive area comprises forming a photodiode and forming a charge storage region comprises forming a floating diffusion region in the substrate.

* * * * *

UNITED STATES PATENT AND TRADEMARK OFFICE
CERTIFICATE OF CORRECTION

PATENT NO. : 7,642,107 B2
APPLICATION NO. : 11/642868
DATED : January 5, 2010
INVENTOR(S) : John Ladd Page 1 of 1

It is certified that error appears in the above-identified patent and that said Letters Patent is hereby corrected as shown below:

Title Page item 54 and Column 1, line 1
In the Title of the Invention:

"SPLIT TRANSFER GATE FOR DARK CURRENT SUPPRESSION AN IMAGER PIXEL" should read --SPLIT TRANSFER GATE FOR DARK CURRENT SUPPRESSION IN AN IMAGER PIXEL--.

In the References Cited:

Page 1, Column 2, U.S. Patent Document No. 7,342,269, the publication date "3/2008" should read --3/2006--.

Signed and Sealed this

Twentieth Day of July, 2010

David J. Kappos
*Director of the United States Patent and Trademark Office*